United States Patent
Aratake

(10) Patent No.: US 8,749,122 B2
(45) Date of Patent: Jun. 10, 2014

(54) PIEZOELECTRIC VIBRATOR HAVING PERIPHERAL NOTCHES THEREIN

(75) Inventor: Kiyoshi Aratake, Chiba (JP)

(73) Assignee: SII Crystal Technology Inc., Chiba-Shi, Chiba (JP)

( * ) Notice: Subject to any disclaimer, the term of this patent is extended or adjusted under 35 U.S.C. 154(b) by 608 days.

(21) Appl. No.: 13/050,284

(22) Filed: Mar. 17, 2011

(65) Prior Publication Data

US 2011/0228643 A1 Sep. 22, 2011

(30) Foreign Application Priority Data

Mar. 19, 2010 (JP) ................................. 2010-065126

(51) Int. Cl.
- *H01L 41/053* (2006.01)
- *H03H 9/10* (2006.01)
- *H03H 9/21* (2006.01)

(52) U.S. Cl.
CPC ............... *H03H 9/1021* (2013.01); *H03H 9/21* (2013.01)
USPC ............................ 310/344; 310/370; 310/348

(58) Field of Classification Search
CPC ....... H03H 9/21; H03H 9/1035; H01L 41/053
USPC .......................................... 310/344; 331/156
See application file for complete search history.

(56) References Cited

U.S. PATENT DOCUMENTS

| | | | | |
|---|---|---|---|---|
| 6,541,897 B2* | 4/2003 | Endoh | ........................... | 310/344 |
| 7,439,658 B2* | 10/2008 | Aratake | ........................ | 310/344 |
| 7,602,107 B2* | 10/2009 | Moriya et al. | ................. | 310/348 |
| 7,605,521 B2* | 10/2009 | Kuwahara | ...................... | 310/344 |
| 7,714,484 B2* | 5/2010 | Hara et al. | ..................... | 310/348 |
| 8,013,499 B2* | 9/2011 | Aratake et al. | ................. | 310/348 |
| 8,069,549 B2* | 12/2011 | Nagano et al. | .................. | 29/594 |
| 8,400,048 B2* | 3/2013 | Shirai et al. | .................... | 310/370 |
| 8,570,110 B2* | 10/2013 | Mizusawa | ........................ | 331/68 |
| 2009/0108709 A1* | 4/2009 | Tsuchido | ........................ | 310/364 |
| 2012/0074816 A1* | 3/2012 | Mizusawa | ...................... | 310/344 |
| 2012/0176004 A1* | 7/2012 | Mizusawa et al. | ............ | 310/348 |
| 2012/0248940 A1* | 10/2012 | Ariji et al. | ...................... | 310/348 |

FOREIGN PATENT DOCUMENTS

| | | | | | |
|---|---|---|---|---|---|
| JP | 2000223996 A | * | 8/2000 | ............... | H03H 9/19 |
| JP | 2002-124845 A | | 4/2002 | | |

* cited by examiner

*Primary Examiner* — J. San Martin
(74) *Attorney, Agent, or Firm* — Brinks Gilson & Lione

(57) ABSTRACT

Provided are a vacuum package and a method for manufacturing the vacuum package having excellent airtightness and capable of improving mounting strength, and a piezoelectric vibrator, an oscillator, an electronic device, and a radio-controlled timepiece. The package includes a base substrate and a lid substrate bonded to each other, a cavity formed between the base substrate and the lid substrate and configured to be capable of sealing a piezoelectric vibrating reed, and penetration electrodes penetrating through the base substrate in the thickness direction so as to make the inner side of the cavity and the outer side conductive. Portions of the base substrate and the lid substrate in the vicinity of the cavity form bonding regions in which the two substrates are bonded. A notch portion through which the bonding surface of the lid substrate is exposed as seen from the thickness direction of the base substrate is formed on the corner portions of the base substrate.

7 Claims, 15 Drawing Sheets

PIEZOELECTRIC VIBRATOR HAVING PERIPHERAL NOTCHES THEREIN

RELATED APPLICATIONS

This application claims priority under 35 U.S.C. §119 to Japanese Patent Application No. 2010-065126 filed on Mar. 19, 2010, the entire content of which is hereby incorporated by reference.

BACKGROUND OF THE INVENTION

1. Field of the Invention

The present invention relates to a vacuum package, a method for manufacturing the vacuum package, a piezoelectric vibrator, and an oscillator, an electronic device, and a radio-controlled timepiece each having the piezoelectric vibrator.

2. Description of the Related Art

Recently, a piezoelectric vibrator (vacuum package) utilizing quartz or the like has been used in cellular phones and portable information terminals as the time source, the timing source of a control signal, a reference signal source, and the like. Although there are various piezoelectric vibrators of this type, a surface mounted device-type piezoelectric vibrator is known as one example thereof (for example, see JP-A-2002-124845).

As shown in FIGS. 18 and 19, a piezoelectric vibrator 200 includes a base substrate 201 and a lid substrate 202 which are anodically bonded to each other by a bonding film 207 and a piezoelectric vibrating reed 203 which is sealed in a cavity C formed between the two substrates 201 and 202.

The base substrate 201 and the lid substrate 202 are insulating substrates made of glass and the like. A penetration hole 204 is formed on the base substrate 201 so as to penetrate through the base substrate 201. A penetration electrode 205 is formed in the penetration hole 204 so as to block the penetration hole 204. The penetration electrode 205 is electrically connected to outer electrodes 206 which are formed on the outer surface of the base substrate 201 and is electrically connected to the piezoelectric vibrating reed 203 through lead-out electrodes 209 which are formed on the inner surface (inside the cavity C). The piezoelectric vibrating reed 203 is a tuning-fork type vibrating reed, for example, and is mounted on the lead-out electrodes 209 on the base end side thereof by a conductive adhesive E or the like. As shown in FIG. 19, the piezoelectric vibrator 200 is mounted when the outer electrodes 206 are connected to lands 211 provided on a silicon device 210 by a solder 212 or the like.

Subsequently, a method for manufacturing the piezoelectric vibrator described above will be described briefly based on FIG. 20. In FIG. 20, for better understanding of the drawings, the illustration of the piezoelectric vibrating reed 203 accommodated in the cavity C is omitted.

As shown in FIG. 20, a lid substrate wafer 220 in which a plurality of recess portions 220a for the cavity C is formed and a base substrate wafer 230 in which a plurality of piezoelectric vibrating reeds 203 (see FIG. 18) is mounted are anodically bonded by the bonding film 207 under a vacuum atmosphere. In this way, a wafer assembly 240 in which a plurality of piezoelectric vibrators 200 is formed in the matrix direction of the two wafers 220 and 230 is obtained. Thereafter, the wafer assembly 240 is cut in the matrix direction for each cavity C, whereby the wafer assembly 240 is fragmented into a plurality of piezoelectric vibrators 200.

However, in the step of manufacturing the piezoelectric vibrator 200, when the lid substrate wafer 220 and the base substrate wafer 230 are anodically bonded, outgas (for example, oxygen) is discharged from a bonding portion. At that time, the outgas is discharged from the outer circumferential ends of the two wafers 220 and 230 to the outside through the gap between the two wafers 220 and 230.

However, as described above, since the outer circumferential ends of the two wafers 220 and 230 serve as the discharge ports of the outgas discharged into the recess portions 220a, it is difficult to degas the outgas from the respective recess portions 220a. Therefore, there is concern that the two wafers 220 and 230 are anodically bonded in a state in which the outgas remains in the recess portion 220a. As a result, the degree of vacuum in the cavity C decreases, and an equivalent resistance value (effective resistance value: Re) increases. In this case, there is a problem in that the driving voltage of the piezoelectric vibrator 200 increases, and thus energy efficiency decreases.

Furthermore, when the piezoelectric vibrator 200 is mounted on the silicon device 210, since the outer electrodes 206 and the lands 211 are surface-to-surface bonded, there is a problem in that it is difficult to form fillets (the wet portions of the solder 212 flowing over the side surfaces of the piezoelectric vibrator 200 to cover the side surfaces) to the side surfaces of the piezoelectric vibrator 20, and a mounting strength is low.

SUMMARY OF THE INVENTION

The present invention has been made in view of the above problems, and an object of the present invention is to provide a vacuum package and a method for manufacturing the vacuum package having excellent airtightness and capable of improving a mounting strength, and to provide a piezoelectric vibrator, an oscillator, an electronic device, and a radio-controlled timepiece.

In order to solve the problems, the invention provides the following means.

According to an aspect of the present invention, there is provided a vacuum package including: a first substrate and a second substrate bonded to each other; a cavity formed between the first and second substrates and configured to be capable of sealing an electronic component therein; and a penetration electrode penetrating through the first substrate among the two substrates in the thickness direction thereof so as to make an inner side of the cavity and an outer side conductive, in which portions of the first and second substrates in the vicinity of the cavity form bonding regions in which the first and second substrates are bonded, and a notch portion through which the bonding region of the second substrate is exposed as seen from the thickness direction of the first substrate is formed on a portion of the first substrate close to an outer circumference of the bonding region.

According to this configuration, since the notch portion is formed on the bonding region of the first substrate, when the first and second substrates are bonded in a wafer state in which a plurality of vacuum packages (cavities) is formed, outgas generated from the bonding region at the time of bonding is discharged through the notch portion. That is, since the notch portion functions as a discharge port of the outgas from the bonding region, the discharge port is formed for each cavity in the wafer. Therefore, the outgas can be effectively discharged as compared to the related art in which the outgas is discharged from only the outer circumferential end of the wafer. As a result, since the substrates can be bonded in a state in which the presence of remaining outgas in the cavity is suppressed, it is possible to provide a vacuum package having excellent airtightness.

Moreover, when the vacuum package of the present invention is mounted on an electronic device or the like, and the vacuum package and the lands on the electronic device are connected by a solder or the like, the wet portions of the solder or the like flow into the notch portion, whereby fillets which cover the side surfaces of the vacuum package are formed. Therefore, it is possible to increase the size of the bonding region between the vacuum package and the electronic device and to improve the mounting strength of the vacuum package.

In the vacuum package, it is preferable that a metal film having conductive properties is formed on an inner surface of the notch portion.

According to this configuration, since the metal film is formed on the inner surface of the notch portion, when the vacuum package is mounted on an electronic device, the wet portions of the solder or the like can easily flow over the metal film into the notch portion. Therefore, fillets can be formed easily, and the mounting strength of the vacuum package can be securely improved.

In the vacuum package, it is preferable that the first substrate is formed in a rectangular shape as seen from the thickness direction, and the notch portion is formed in corner portions of the first substrate.

According to this configuration, since the notch portion is formed in the respective corner portions of the first substrate, it is possible to effectively discharge the outgas generated from the bonding region at the time of bonding the wafers and to further improve the degree of vacuum of the vacuum package.

Moreover, since fillets are formed in the vicinities of the respective corner portions of the vacuum package, it is possible to further improve the mounting strength of the vacuum package and to mount the vacuum package in a well-balanced manner.

According to another aspect of the present invention, there is provided a method of manufacturing the vacuum package of the above aspect, including: a notch forming step of forming a notch portion, through which the bonding region of the second substrate is exposed as seen from the thickness direction of the first substrate, on a portion of the first substrate close to an outer circumference of the bonding region; and a bonding step of anodically bonding the first and second substrates by a bonding film which has conductive properties and which is formed between the first and second substrates.

According to this configuration, since the notch portion is formed in the first substrate in the notch forming step, the outgas generated at the time of bonding the wafers in the bonding step is discharged through the notch portion. That is, since the notch portion functions as a discharge port of the outgas from the bonding region, the discharge port is formed for each cavity. Therefore, the outgas can be effectively discharged as compared to the related art in which the outgas is discharged from only the outer circumferential end of the substrate. As a result, since the substrates can be bonded in a state in which the presence of remaining outgas in the cavity is suppressed, it is possible to provide a vacuum package having excellent airtightness.

Moreover, when the vacuum package of the present invention is mounted on an electronic device or the like, and the penetration electrode of the vacuum package and the lands on the electronic device are connected by a solder or the like, the wet portions of the solder or the like flow into the notch portion, whereby fillets which cover the side surfaces of the vacuum package are formed. Therefore, it is possible to increase the size of the bonding region between the vacuum package and the electronic device and to improve the mounting strength of the vacuum package.

In the vacuum package manufacturing method, it is preferable that the method includes, at the end of the notch forming step, an outer electrode forming step of forming an outer electrode on an outer surface of the first substrate so as to cover the penetration electrode, and the metal film made of the same material as the outer electrode is formed on the inner surface of the notch portion at the same time as the outer electrode forming step.

According to this configuration, since the notch portion is formed in the first substrate, a conductive material serving as the outer electrode is also deposited to the inner surface of the notch portion at the time of forming the outer electrode. In this way, it is possible to form the metal film on the inner surface of the notch portion. That is, since the outer electrode and the metal film can be formed collectively in the outer electrode forming step, it is not necessary to perform an additional metal film forming step, and it is possible to suppress the decrease in manufacturing efficiency caused by adding the metal film.

According to a further aspect of the present invention, there is provided a piezoelectric vibrator in which a piezoelectric vibrating reed is airtightly sealed in the cavity of the vacuum package according to the above aspect of the present invention.

According to this configuration, since the piezoelectric vibrator includes the vacuum package having excellent airtightness, it is possible to improve the vacuum sealing reliability of the piezoelectric vibrator. In this way, since a series resonance resistance value (R1) of the piezoelectric vibrator is maintained at a low state, it is possible to vibrate the piezoelectric vibrating reed with a low power. Thus, it is possible to manufacture a piezoelectric vibrator having excellent energy efficiency.

According to a still further aspect of the present invention, there is provided an oscillator in which the piezoelectric vibrator according to the above aspect of the present invention is electrically connected to an integrated circuit as an oscillating piece.

According to a still further aspect of the present invention, there is provided an electronic device in which the piezoelectric vibrator according to the above aspect of the present invention is electrically connected to a clock section.

According to a still further aspect of the present invention, there is provided a radio-controlled timepiece in which the piezoelectric vibrator according to the above aspect of the present invention is electrically connected to a filter section.

In the oscillator, electronic device, and radio-controlled timepiece according to the above aspects of the present invention, since they have the above-described piezoelectric vibrator having excellent energy efficiency, it is possible to provide products having excellent energy efficiency similarly to the piezoelectric vibrator.

According to the package and package manufacturing method according to the above aspects of the present invention, it is possible to provide a package having excellent airtightness and improved mounting strength.

According to the piezoelectric vibrator according to the above aspect of the present invention, it is possible to manufacture a piezoelectric vibrator having excellent energy efficiency.

In the oscillator, electronic device, and radio-controlled timepiece according to the above aspects of the present invention, since they have the above-described piezoelectric vibrator, it is possible to provide products having excellent energy efficiency similarly to the piezoelectric vibrator.

BRIEF DESCRIPTION OF TUE DRAWINGS

DETAILED DESCRIPTION OF THE PREFERRED EMBODIMENTS

Hereinafter, an embodiment of the present invention will be described with reference to the drawings.

Piezoelectric Vibrator

Figure 1:
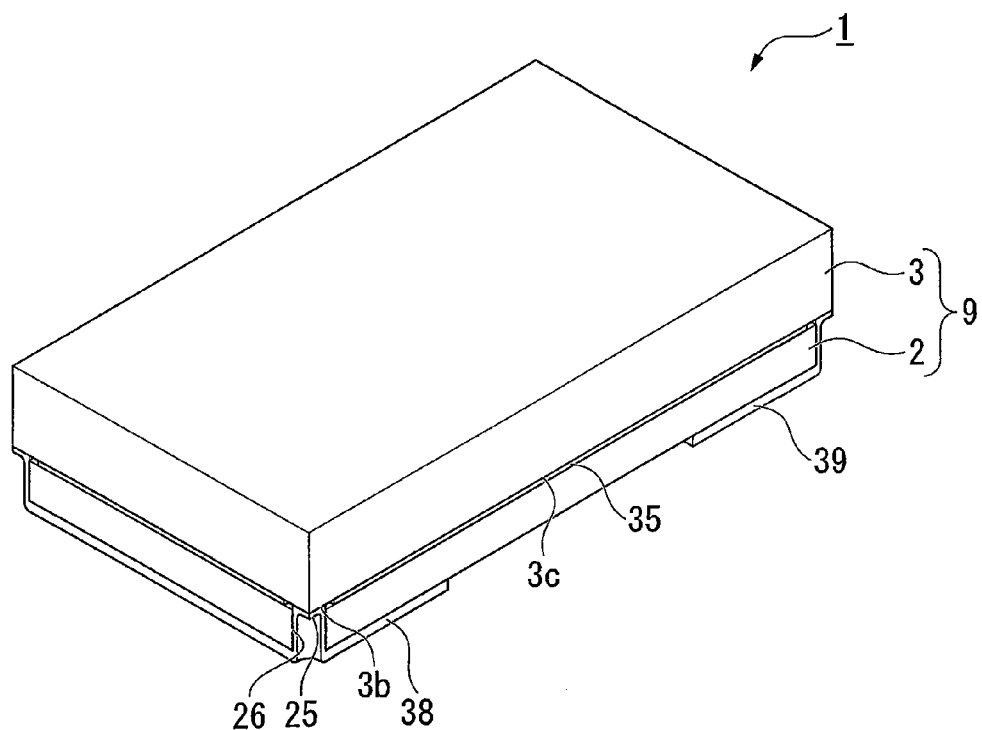
FIG. 1 is a perspective view showing an external appearance of a piezoelectric vibrator according to an embodiment of the present invention as seen from the side of a lid substrate.
Figure 2:
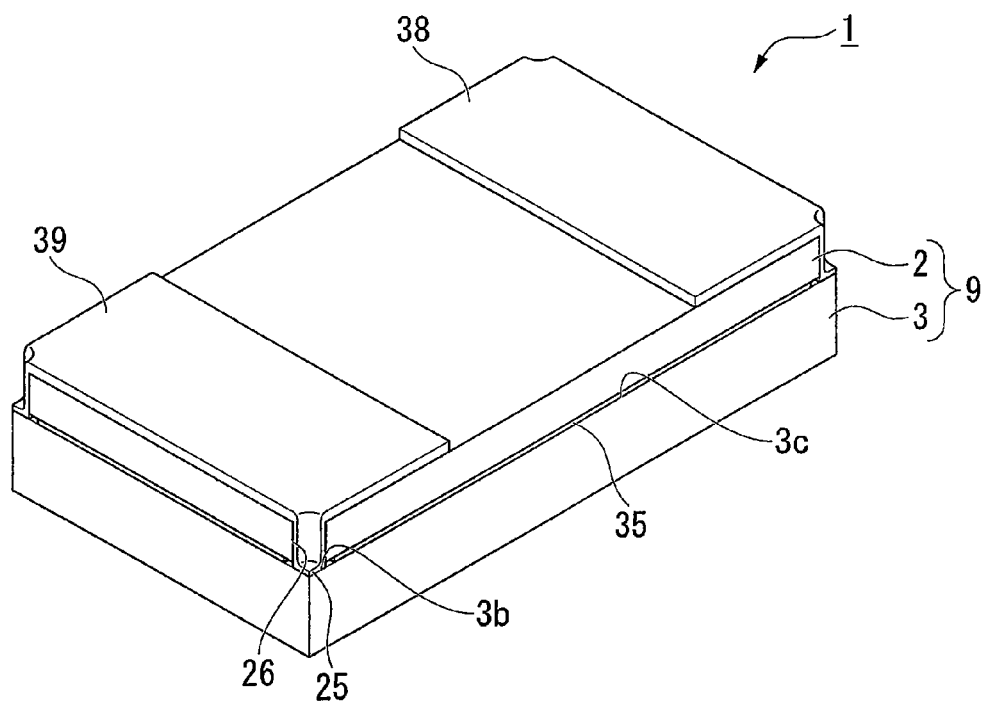
FIG. 2 is a perspective view showing an external appearance of the piezoelectric vibrator according to an embodiment of the present invention as seen from the side of a base substrate.
Figure 3:
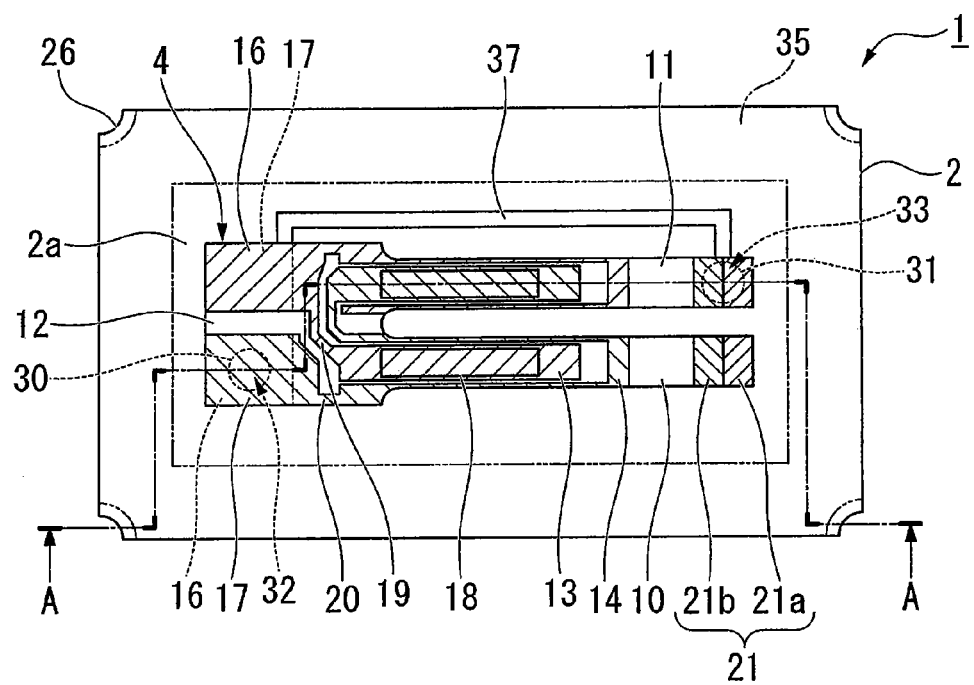
FIG. 3 is a top view of the piezoelectric vibrator, showing a state where the lid substrate is removed.
Figure 4:
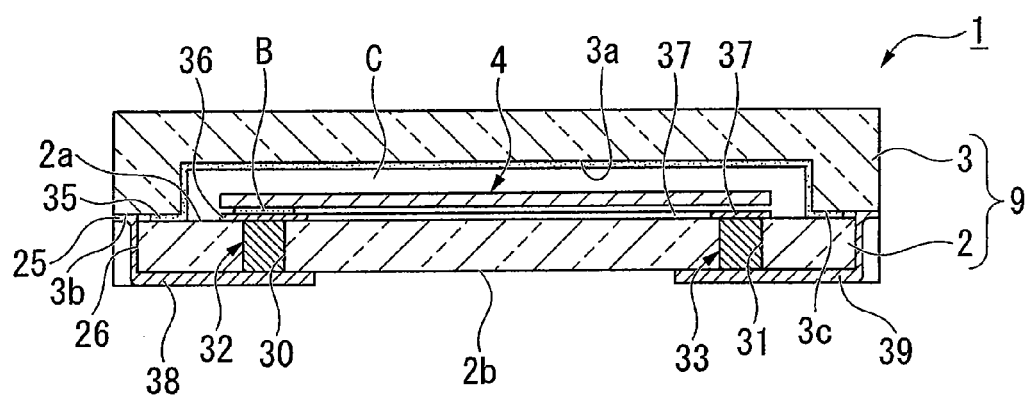
FIG. 4 is a cross-sectional view of the piezoelectric vibrator taken along the line A-A in FIG. 3.
Figure 5:
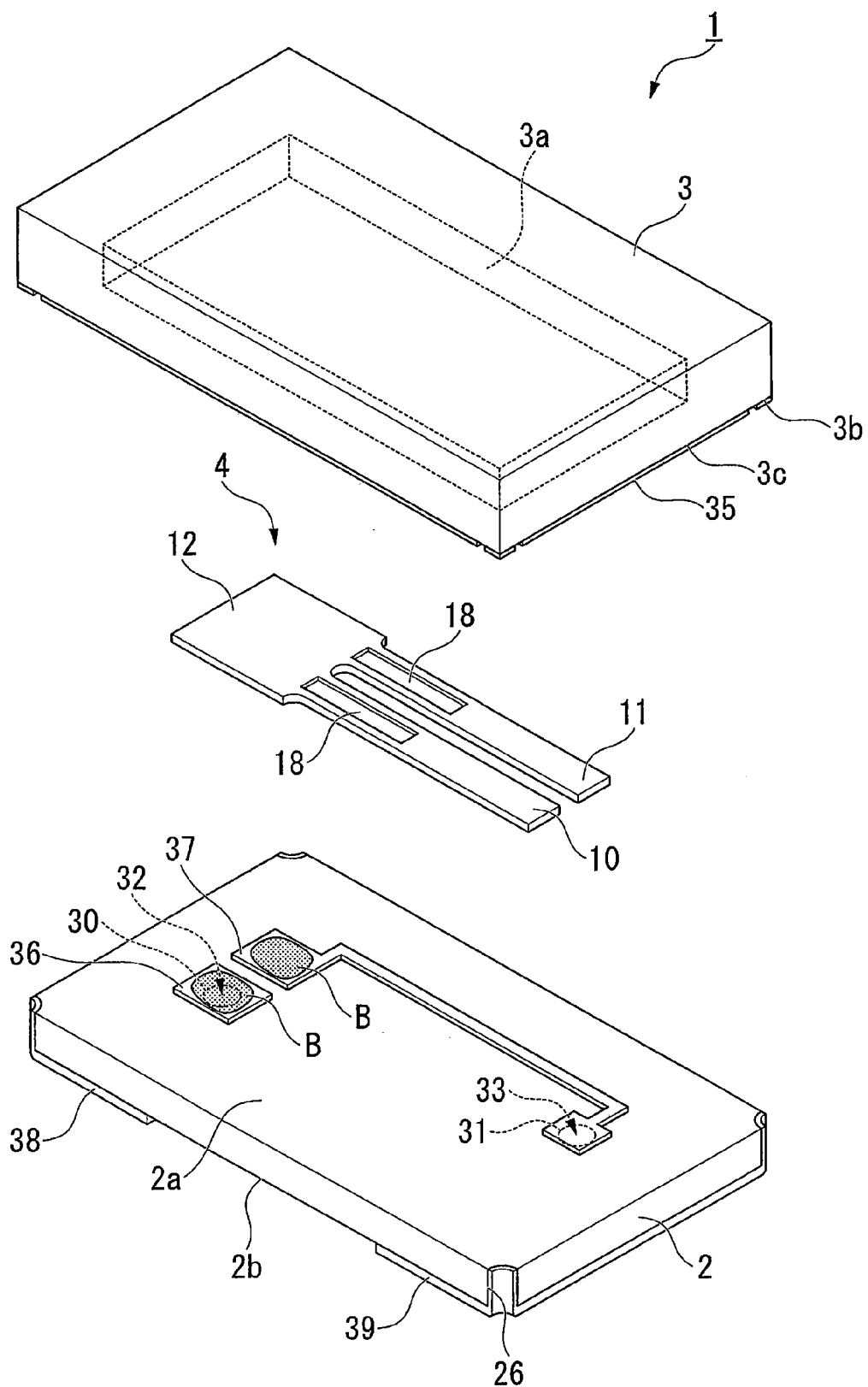
FIG. 5 is an exploded perspective view of the piezoelectric vibrator.

First, a piezoelectric vibrator according to the embodiment of the present invention will be described with reference to the drawings. FIG. 1 is a perspective view showing an external appearance of a piezoelectric vibrator according to an embodiment of the present invention as seen from the side of a lid substrate; and FIG. 2 is a perspective view showing an external appearance of the piezoelectric vibrator according to an embodiment of the present invention as seen from the side of a base substrate. Moreover, FIG. 3 is a top view of the piezoelectric vibrator, showing a state where the lid substrate is removed; FIG. 4 is a cross-sectional view of the piezoelectric vibrator taken along the line A-A in FIG. 3; and FIG. 5 is an exploded perspective view of the piezoelectric vibrator. In FIG. 5, for better understanding of the drawings, the illustrations of excitation electrode 15, extraction electrodes 19 and 20, mount electrodes 16 and 17, and weight metal film 21 of a piezoelectric vibrating reed 4 described later are omitted.

As shown in FIGS. 1 to 5, a piezoelectric vibrator 1 according to the present embodiment is a surface mounted device-type piezoelectric vibrator 1 which includes a package 9, in which a base substrate (first substrate) 2 and a lid substrate (second substrate) 3 are anodically bonded by a bonding material 35, and a piezoelectric vibrating reed 4 which is accommodated in a cavity C of the package 9.

Figure 6:
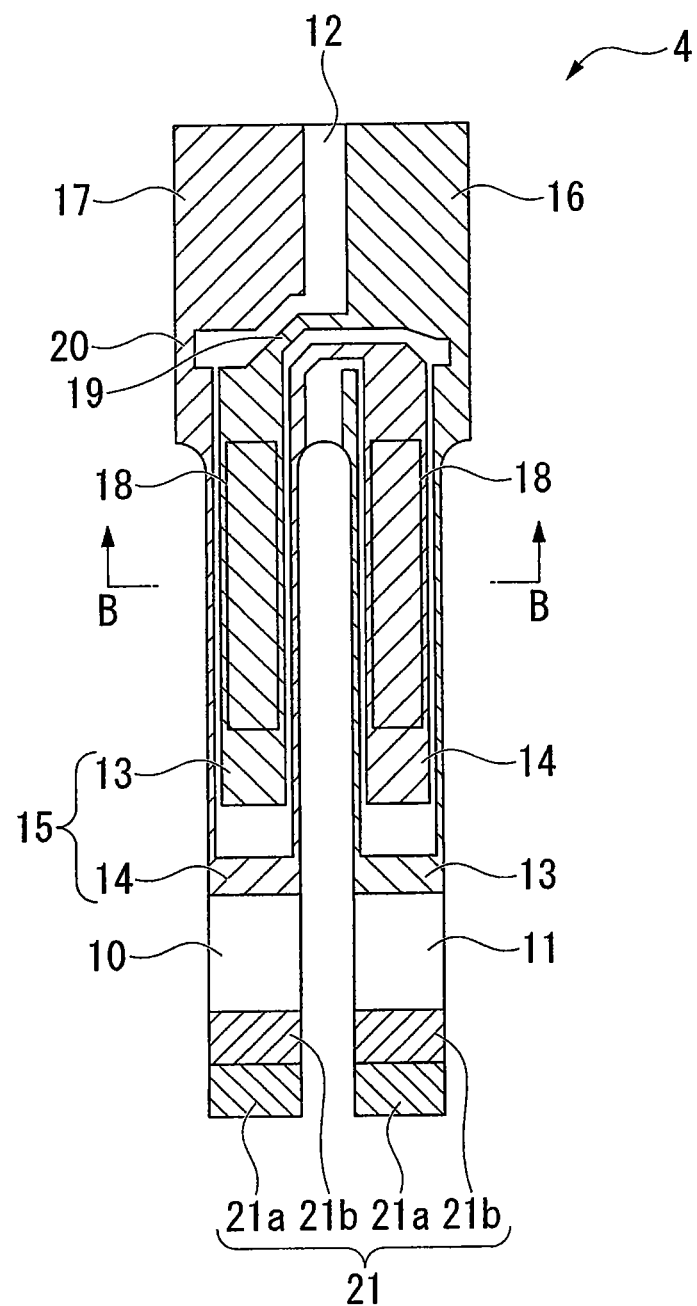
FIG. 6 is a top view of a piezoelectric vibrating reed.
Figure 7:
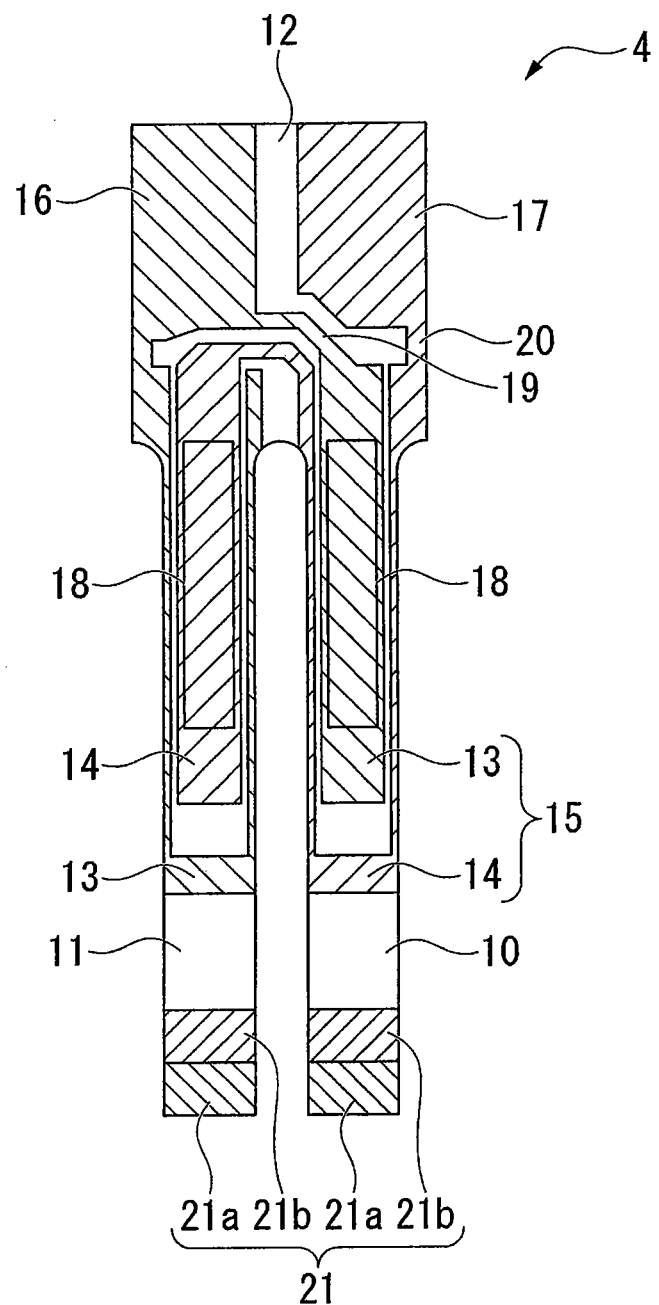
FIG. 7 is a bottom view of the piezoelectric vibrating reed.

FIG. 6 is a top view of a piezoelectric vibrating reed; FIG. 7 is a bottom view of the piezoelectric vibrating reed; and FIG. 8 is a cross-sectional view taken along the line B-B in FIG. 6.

Figure 8:
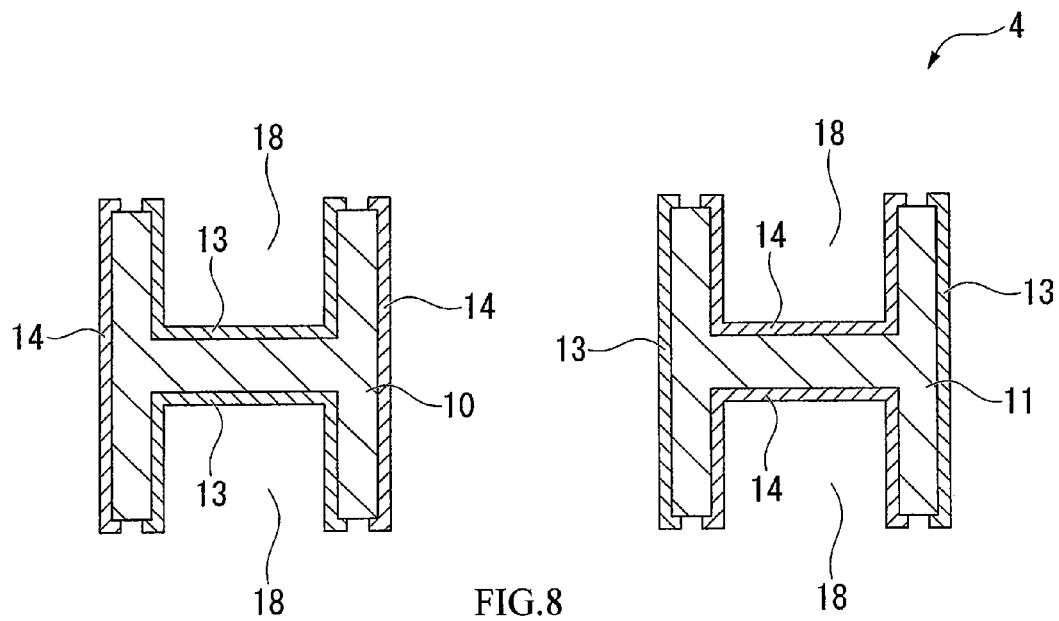
FIG. 8 is a cross-sectional view taken along the line B-B in FIG. 6.

As shown in FIGS. 6 to 8, the piezoelectric vibrating reed 4 is a turning-fork type vibrating reed which is made of a piezoelectric material such as crystal, lithium tantalate, or lithium niobate and is configured to vibrate when a predetermined voltage is applied thereto. The piezoelectric vibrating reed 4 includes a pair of vibrating arms 10 and 11 disposed in parallel to each other, a base portion 12 to which the base end sides of the pair of vibrating arms 10 and 11 are integrally fixed, and groove portions 18 which are formed on both principal surfaces of the pair of vibrating arms 10 and 11. The groove portions 18 are formed so as to extend from the base end sides of the vibrating arms 10 and 11 along the longitudinal direction of the vibrating arms 10 and 11 up to approximately the middle portions thereof.

In addition, the piezoelectric vibrating reed 4 of the present embodiment includes: an excitation electrode 15 which is formed on the outer surfaces of the pair of vibrating arms 10 and 11 and includes a first excitation electrode 13 and a second excitation electrode 14 so as to allow the pair of vibrating arms 10 and 11 to vibrate; and mount electrodes 16 and 17 which are electrically connected to the first excitation electrode 13 and the second excitation electrode 14, respectively. The excitation electrode 15, mount electrodes 16 and 17, and extraction electrodes 19 and 20 are formed by a coating of a conductive film of chromium (Cr), nickel (Ni), aluminum (Al), and titanium (Ti), for example.

The excitation electrode 15 is an electrode that allows the pair of vibrating arms 10 and 11 to vibrate at a predetermined resonance frequency in a direction moving closer to or away from each other. The first excitation electrode 13 and second excitation electrode 14 that constitute the excitation electrode 15 are patterned and formed on the outer surfaces of the pair of vibrating arms 10 and 11 in an electrically isolated state. Specifically, the first excitation electrode 13 is mainly formed on the groove portion 18 of one vibrating arm 10 and both side surfaces of the other vibrating arm 11. On the other hand, the second excitation electrode 14 is mainly formed on both side surfaces of one vibrating arm 10 and the groove portion 18 of the other vibrating arm 11. Moreover, the first excitation electrode 13 and the second excitation electrode 14 are electrically connected to the mount electrodes 16 and 17 via the extraction electrodes 19 and 20, respectively, on both principal surfaces of the base portion 12.

Furthermore, the tip ends of the pair of the vibrating arms 10 and 11 are coated with a weight metal film 21 for adjustment of the vibration states (tuning the frequency) of the pair of the vibrating arms 10 and 11 in a manner such as to vibrate within a predetermined frequency range. The weight metal film 21 is divided into a rough tuning film 21a used for tuning the frequency roughly and a fine tuning film 21b used for tuning the frequency finely.

As shown in FIGS. 1, 2, 4, and 5, the lid substrate 3 is a substrate that can be anodically bonded and that is made of a glass material, for example, soda-lime glass, and is formed in a substrate-like form. On a bonding surface side of the lid substrate 3 to be bonded to the base substrate 2, a recess portion 3a for a cavity C is formed in which the piezoelectric vibrating reed 4 is accommodated.

A bonding material 35 for anodic bonding is formed on approximately the entire surface (inner surface) on the bonding surface side of the lid substrate 3 to be bonded to the base substrate 2. Specifically, in addition to the entire inner surface of the recess portion 3a, the bonding material 35 is formed on the entire region other than the corner portions of a frame region 3c which is formed around the recess portion 3a and which is a bonding surface to be bonded to the base substrate 2. That is to say, the respective corner portions of the frame region 3c serve as non-formation regions 3b of the bonding material 35, and a region obtained by subtracting the non-formation regions 3b from the frame region 3c is a bonding region of the present invention. In the present embodiment, the non-formation regions 3b are formed in a fan shape (central angle: 90°) about the corner portions of the lid substrate 3, for example. Moreover, a metal film 25 made of a conductive material is formed on the non-formation regions 3b. The metal film 25 is formed to be spaced from the end of the bonding material 35, and the bonding material 35 and the metal film 25 are in an electrically isolated state. Although the bonding material 35 of the present embodiment is made of a Si film, the bonding material 35 may be made of Al. In addition, as the bonding material, a Si bulk material whose resistance value is reduced by doping or the like may be used. As will be described later, the bonding material 35 and the base substrate 2 are anodically bonded, whereby the cavity C is vacuum-sealed.

The base substrate 2 is a substrate that is made of a glass material, for example, soda-lime glass, and is formed in an approximately substrate-like form having the same outer shape as the lid substrate 3 as shown in FIGS. 1 to 5.

On an inner surface 2a side (a bonding surface side to be bonded to the lid substrate 3) of the base substrate 2, a pair of lead-out electrodes 36 and 37 is patterned. The lead-out electrodes 36 and 37 are formed by a laminated structure of a lower Cr film and an upper Au film, for example.

As shown in FIGS. 4 and 5, the mount electrodes 16 and 17 of the above-described piezoelectric vibrating reed 4 are bump-bonded to the surfaces of the lead-out electrodes 36 and 37 via bumps B made of gold or the like. The piezoelectric vibrating reed 4 is bonded in a state where the vibrating arms 10 and 11 are floated from the inner surface 2a of the base substrate 2.

In addition, a pair of penetration electrodes 32 and 33 is formed on the base substrate 2 so as to penetrate through the base substrate 2. The penetration electrodes 32 and 33 are formed of a metallic material having conductive properties such as stainless steel, Ag, or Al. One penetration electrode 32 is formed right below one lead-out electrode 36. The other penetration electrode 33 is formed in the vicinity of a tip end of the vibrating arm 11 and is connected to the other lead-out electrode 37 via a lead-out wiring.

In addition, a pair of outer electrodes 38 and 39 is formed on an outer surface 2b of the base substrate 2 as shown in FIGS. 1, 2, 4, and 5. The pair of outer electrodes 38 and 39 is formed at both ends in the longitudinal direction of the base substrate 2 and is electrically connected to the pair of penetration electrodes 32 and 33. When the piezoelectric vibrator 1 is mounted on a silicon device 70 described later, the outer electrodes 38 and 39 are connected to land portions 72 of the silicon device 70, and a voltage is applied to the piezoelectric vibrating reed 4 through the outer electrodes 38 and 39.

Here, notch portions 26 are formed at the corner portions of the base substrate 2, and are notched in a fan shape (for example, central angle: 90°) about the corner portions. These notch portions 26 are formed on the entire region in the thickness direction so as to extend from the outer surface 2b of the base substrate 2 towards the inner surface 2a, and the above-described corner portions (the non-formation regions 3b) of the lid substrate 3 are exposed through the notch portions 26 as seen from the thickness direction of the base substrate 2. That is, the corner portions of the bonding surface (the frame region 3c) of the lid substrate 3 are portions which do not overlap with the base substrate 2. Moreover, the end surface positions of the notch portions 26 in the surface direction of the substrates 2 and 3 are on the inner side in the surface direction than the above-described corner portions of the lid substrate 2 and on the outer side in the surface direction than the ends (the boundary portions between the bonding material 35 and the non-formation regions 3b) of the bonding material 35. The above-described metal film 25 is formed on portions (end portions of the corner portions) of the corner portions of the lid substrate 3 which do not overlap with the base substrate 2. In this way, the metal film 25 is electrically isolated from the outer electrodes 38 and 39. Moreover, since the metal film 25 is a film which is formed by deposition of the constituent materials of the outer electrodes 38 and 39 at the time of forming the outer electrodes 38 and 39, the metal film 25 is also formed on the inner surfaces of the notch portions 26 although not shown in the drawing, in addition to the non-formation regions 3b of the lid substrate 3. That is, the outer electrodes 38 and 39 and the metal film 25 are continuously formed of the same material.

Piezoelectric Device

Figure 9:
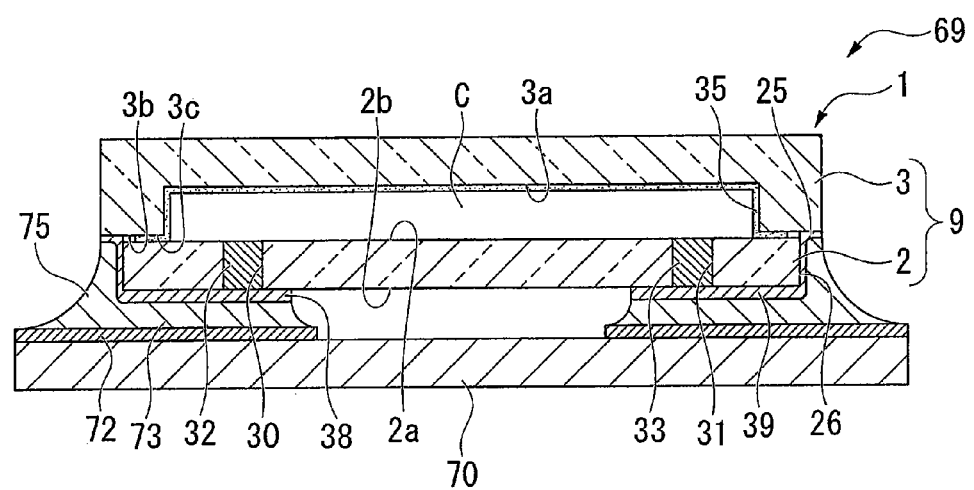
FIG. 9 is a cross-sectional view of a piezoelectric device.

FIG. 9 is a cross-sectional view of a piezoelectric device. In FIG. 9, the cross section of the piezoelectric vibrator 1 corresponding to that in FIG. 4 is shown, and the illustrations of the piezoelectric vibrating reed 4 and the like accommodated in the cavity C are omitted for better understanding of the drawing.

As shown in FIG. 9, a piezoelectric device 69 includes a silicon device 70 such as a RCT module and the above-described piezoelectric vibrator 1 mounted on the silicon device 70. On the silicon device 70, land portions 72 for achieving electrical connection to the piezoelectric vibrator 1 are formed, and the outer electrodes 38 and 39 of the piezoelectric vibrator 1 and the land portions 72 are mounted using a solder 73.

In this case, according to the present embodiment, since the metal film 25 which is formed to be continuous from the outer electrodes 38 and 39 is formed on the end surfaces of the notch portions 26 and the non-formation regions 3b of the lid substrate 3, when the piezoelectric vibrator 1 is soldered, a wet part of the solder 73 flows over the metal film 25 to reach the non-formation regions 3b of the lid substrate 3. In this way, since fillets 75 which cover the side surfaces of the piezoelectric vibrator 1 and which widen in a skirt shape along the surface direction of the silicon device 70 are formed in the vicinities of the corner portions of the piezoelectric vibrator 1, the piezoelectric vibrator 1 can be tightly fixed onto the silicon device 70. Therefore, it is possible to improve the mounting strength of the piezoelectric vibrator 1 and to secure the strength of the piezoelectric device 69. Moreover, since the fillets 75 are formed in the vicinities of the respective corner portions of the piezoelectric vibrator 1, it is possible to secure the mounting strength of the piezoelectric vibrator 1 and to mount the piezoelectric vibrator 1 on the silicon device 70 in a well-balanced manner.

When the piezoelectric vibrator 1 configured in this manner is operated, a predetermined driving voltage is applied between the outer electrodes 38 and 39 formed on the base substrate 2 through the land portions 72 of the silicon device 70. By doing so, a current flows from one outer electrode 38 to the first excitation electrode 13 of the piezoelectric vibrating reed 4 through one penetration electrode 32 and one lead-out electrode 36. Moreover, a current flows from the other outer electrode 39 to the second excitation electrode 14 of the piezoelectric vibrating reed 4 through the other penetration electrode 33 and the other lead-out electrode 37. In this way, a current can be made to flow to the excitation electrode 15 including the first and second excitation electrodes 13 and 14, of the piezoelectric vibrating reed 4, and the pair of vibrating arms 10 and 11 is allowed to vibrate at a predetermined frequency in a direction moving closer to or away from each other. This vibration of the pair of vibrating arms 10 and 11 can be used as the time source, the timing source of a control signal, the reference signal source, and the like.

Piezoelectric Vibrator Manufacturing Method

Figure 10:
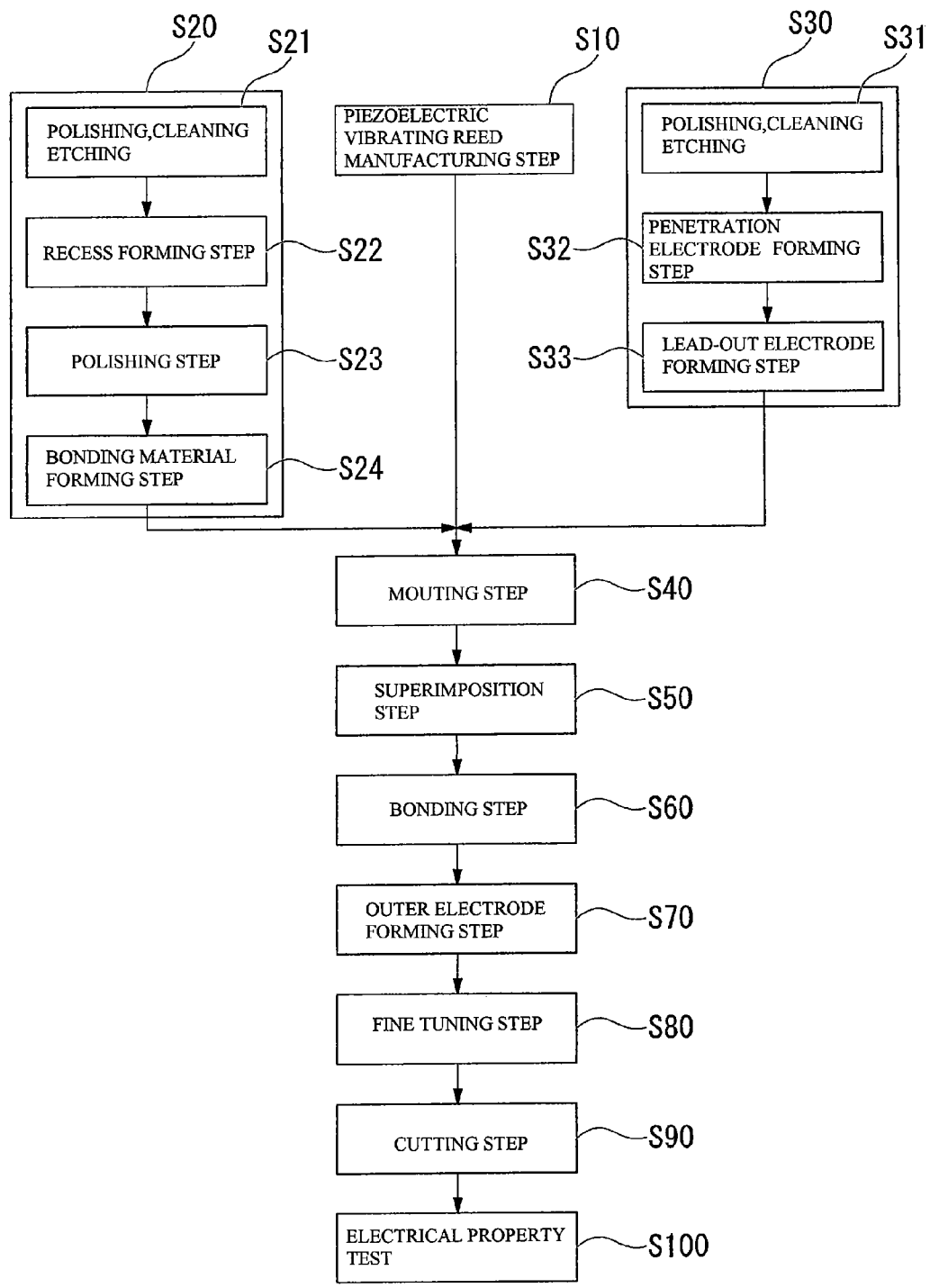
FIG. 10 is a flowchart of the method for manufacturing a piezoelectric vibrator.
Figure 11:
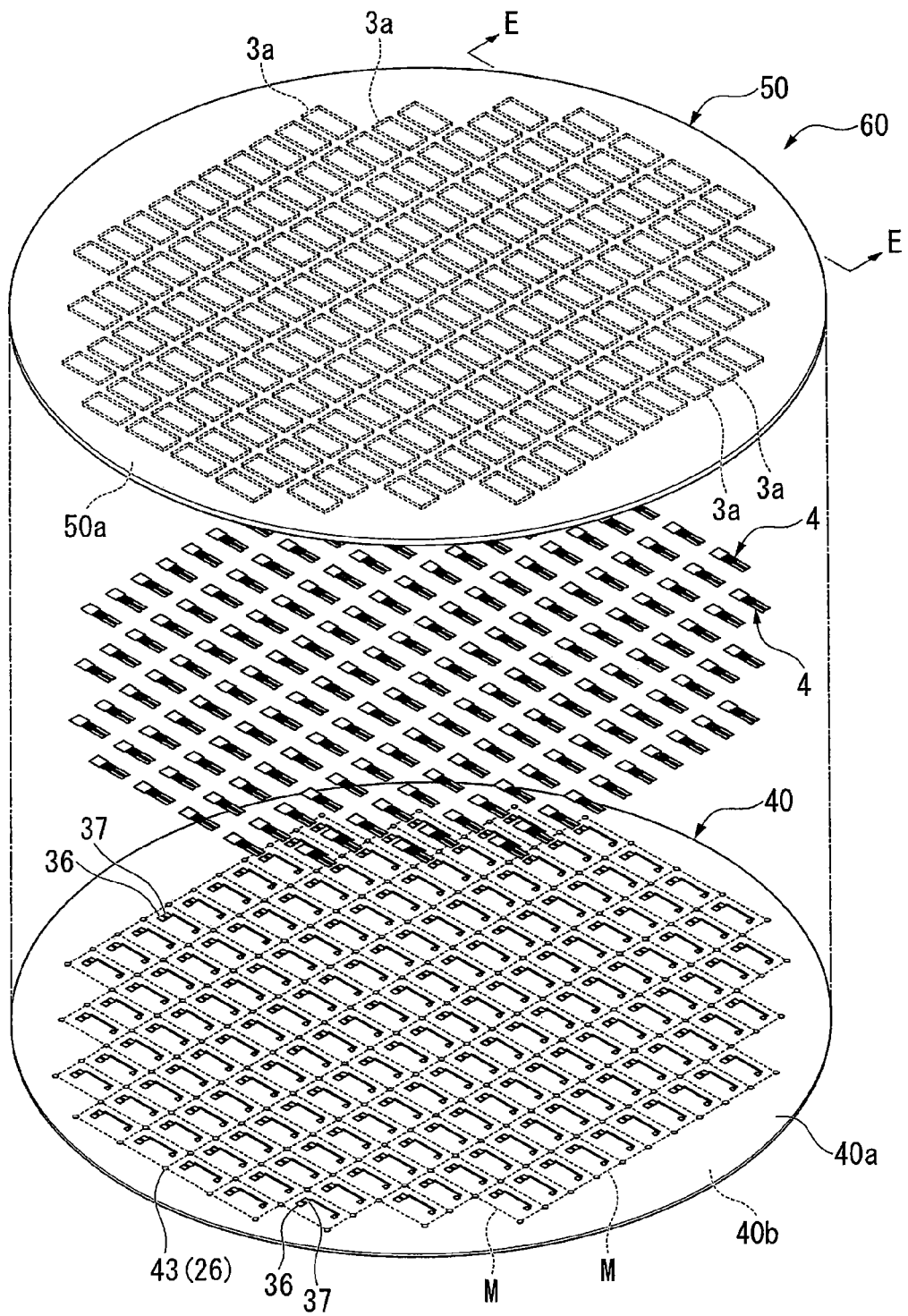
FIG. 11 is an exploded perspective view of a wafer assembly.

Next, a method for manufacturing the piezoelectric vibrator according to the present embodiment will be described. FIG. 10 is a flowchart of the method for manufacturing a piezoelectric vibrator. FIG. 11 is an exploded perspective view of a wafer assembly. In the following description, a method for manufacturing a plurality of piezoelectric vibrators at a time by enclosing a plurality of piezoelectric vibrating reeds 4 between a base substrate wafer 40 and a lid substrate wafer 50 to form a wafer assembly 60 and cutting the wafer assembly 60 will be described. The dotted line M shown in the respective figures starting with FIG. 11 is a cutting line along which a cutting step performed later is achieved.

The manufacturing method of the piezoelectric vibrator according to the present embodiment mainly includes a piezoelectric vibrating reed manufacturing step (S10), a lid substrate wafer manufacturing step (S20), a base substrate wafer manufacturing step (S30), and an assembling step (S40 and subsequent steps). Among the steps, the piezoelectric vibrating reed manufacturing step (S10), the lid substrate wafer manufacturing step (S20), and the base substrate wafer manufacturing step (S30) can be performed in parallel. In addition, the manufacturing method of the piezoelectric vibrator according to the present embodiment includes a method for manufacturing a package in which a lid substrate and a base substrate are anodically bonded with a bonding material interposed therebetween.

In the piezoelectric vibrating reed manufacturing step (S10), the piezoelectric vibrating reed 4 shown in FIGS. 6 to 8 is manufactured. Specifically, first, a rough crystal Lambert is sliced at a predetermined angle to obtain a wafer having a constant thickness. Subsequently, the wafer is subjected to crude processing by lapping, and an affected layer is removed by etching. Then, the wafer is subjected to mirror processing such as polishing to obtain a wafer having a predetermined thickness. Subsequently, the wafer is subjected to appropriate processing such as washing, and the wafer is patterned so as to have the outer shape of the piezoelectric vibrating reed 4 by a photolithography technique. Moreover, a metal film is formed and patterned on the wafer, thus forming the excitation electrode 15, the extraction electrodes 19 and 20, the mount electrodes 16 and 17, and the weight metal film 21. In this way, a plurality of piezoelectric vibrating reeds 4 can be manufactured. Subsequently, rough tuning of the resonance frequency of the piezoelectric vibrating reed 4 is performed. This rough tuning is achieved by irradiating the rough tuning film 21a of the weight metal film 21 with a laser beam to evaporate in part the rough tuning film 21a, thus changing the weight of the vibrating arms 10 and 11.

As shown in FIGS. 10 and 11, in the lid substrate wafer manufacturing step (S20), the lid substrate wafer 50 later serving as the lid substrate 3 is manufactured. In this step, first, a disk-shaped lid substrate wafer 50 made of a soda-lime glass is polished to a predetermined thickness and cleaned, and then, the affected uppermost layer is removed by etching or the like (S21). Subsequently, a plurality of recess portions 3a for cavities is formed on a bonding surface of the lid substrate wafer 50 to be bonded to the base substrate wafer 40 (S22). The recess portions 3a are formed by heat-press molding, etching, or the like. After that, the bonding surface (the frame region 3c) bonded to the base substrate wafer 40 is polished (S23).

Figure 12A:
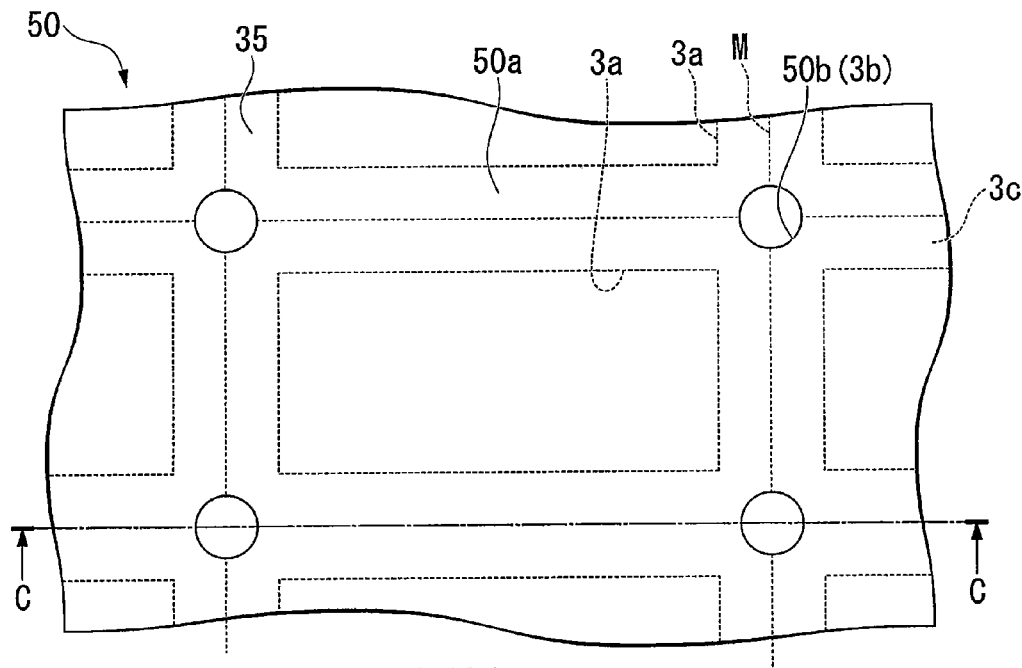
FIGS. 12A and 12B are views showing a state where a bonding material is formed on a lid substrate wafer.
Figure 12B:
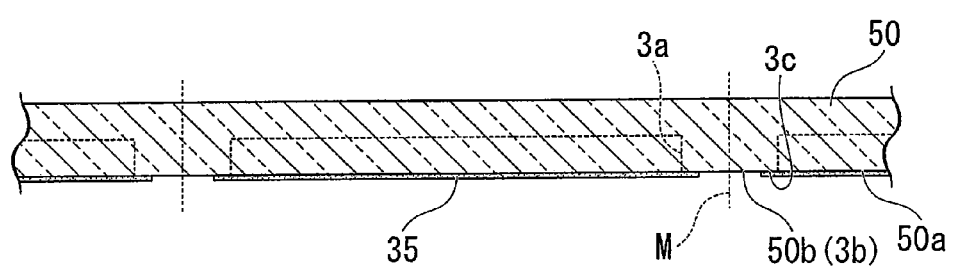

FIGS. 12A and 12B are views showing a state where a bonding material is formed on a lid substrate wafer, in which FIG. 12A is a top view as seen from the inner surface side, and FIG. 12B is a cross-sectional view taken along the line C-C in FIG. 12A.

Subsequently, as shown in FIG. 11 and FIGS. 12A and 12B, the bonding material 35 is formed on the bonding surface (hereinafter, referred to as an inner surface 50a) of the lid substrate wafer 50 to be bonded to the base substrate wafer 40 (S24). Specifically, first, the bonding material 35 is formed on the entire inner surface 50a (the entire inner surfaces of the recess portions 3a and the frame regions 3c in the vicinities of the recess portions 3a) of the lid substrate wafer 50. Moreover, the bonding material 35 in regions which later correspond to the corner portions of the lid substrate 3 is patterned and removed, whereby non-formation regions 50b having a circular shape around the intersections of the cutting lines M are formed. The non-formation regions 50b become the non-formation regions 3b in which the bonding material 35 is removed from regions corresponding to the corner portions of the lid substrate 3 when the lid substrate wafer 50 is divided (into four parts) in a later cutting step. In this way, by forming the non-formation regions 3b of the respective lid substrates 3 collectively as the non-formation regions 50b, it is possible to form the non-formation regions 3b evenly in the respective corner portions of the lid substrate 3 after cutting. Therefore, a patterning mask and the like are simplified, and patterning can be performed in a simple and highly accurate manner as compared to the case of forming the non-formation regions 50b for each lid substrate 3.

The bonding material 35 may be patterned after deposition so that it is formed on only the bonding regions of the lid substrate wafer 50 to be bonded to the base substrate wafer 40. Since the polishing step (S23) is performed before the bonding material forming step (S24), the flatness of the surface of the bonding material 35 can be secured, and stable bonding with the base substrate wafer 40 can be achieved.

Figure 13A:
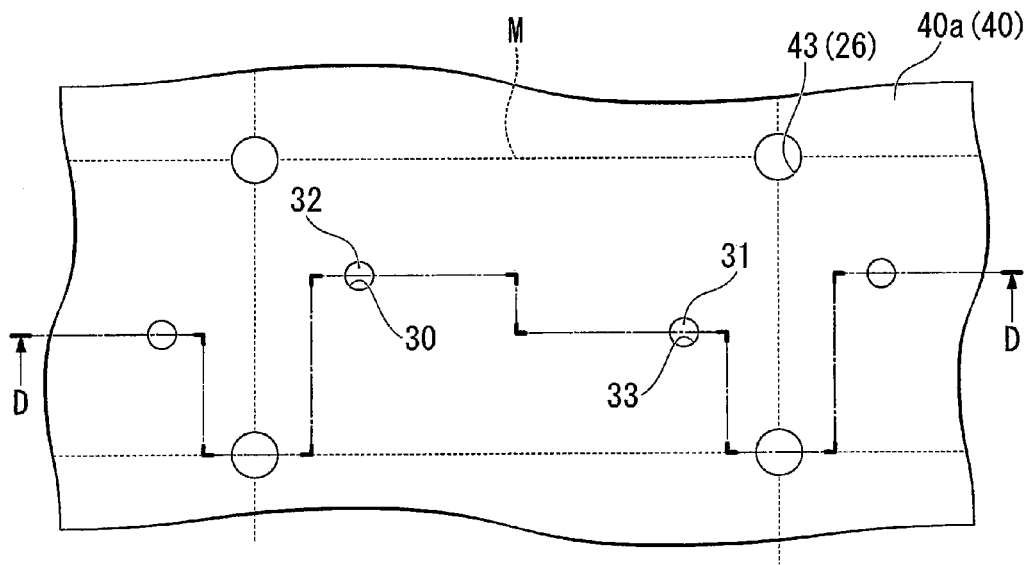
FIGS. 13A and 13B are views showing a state where penetration electrodes are formed on a base substrate wafer.
Figure 13B:
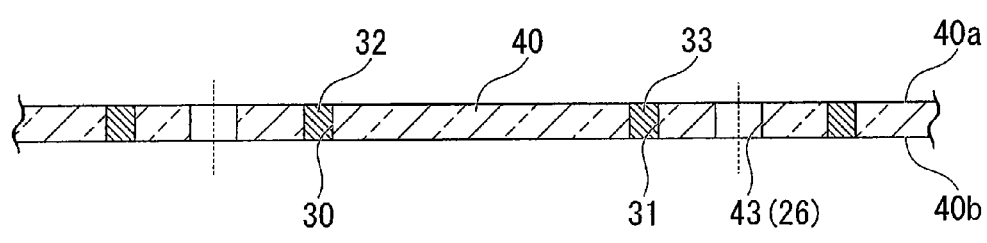

FIGS. 13A and 13B are views showing a state where penetration electrodes are formed on a base substrate wafer, in which FIG. 13A is a top view as seen from the inner surface side, and FIG. 13B is a cross-sectional view taken along the line D-D in FIG. 13A.

As shown in FIGS. 13A and 13B, in the base substrate wafer manufacturing step (S30), the base substrate wafer 40 later serving as the base substrate 2 is manufactured. In this step, first, a disk-shaped base substrate wafer 40 made of a soda-lime glass is polished to a predetermined thickness and cleaned, and then, the affected uppermost layer is removed by etching or the like (S31). Subsequently, a penetration electrode forming step is performed where the pair of penetration electrodes 32 and 33 is formed on the base substrate wafer 40

(S32). The penetration electrodes 32 and 33 are formed by forming the penetration holes 30 and 31 in the base substrate wafer 40, filling a conductive material such as a silver paste in the penetration holes 30 and 31, and baking the conductive material. At that time, penetration holes 43 having a circular shape around the intersections of the cutting lines M are formed at the same time as the forming of the penetration holes 30 and 31. That is, the penetration holes 43 are formed on the respective diagonal lines of the respective cavities C of the lid substrate wafer 50. These penetration holes 43 become the notch portions 26 in which regions corresponding to the corner portions of the base substrate 2 are notched when each of the penetration holes 43 is divided (into four parts) in a later cutting step. In this way, by forming the notch portions 26 of the respective base substrates 2 collectively as the penetration holes 43, it is possible to form the notch portions 26 evenly in the respective corner portions of the base substrate 2 after cutting. Therefore, the notch portions 26 can be formed in a simple and highly accurate manner as compared to the case of forming the notch portions 26 for each base substrate 2. Moreover, the inner diameters of the penetration holes 43 are smaller than the inner diameters of the non-formation regions 50b formed on the lid substrate wafer 50.

Subsequently, a lead-out electrode forming step is performed where the lead-out electrodes 36 and 37 are formed so as to be electrically connected to the pair of penetration electrodes 32 and 33 (S33).

Meanwhile, forming the bonding material 35 on the inner surface 40a of the base substrate wafer 40 together with the lead-out electrodes 36 and 37 may be considered. However, in this case, the bonding material 35 is formed after formation of the lead-out electrodes 36 and 37 and the manufacturing time will increase. In addition, in order to prevent diffusion between both members, it is necessary to form the bonding material 35 while masking the lead-out electrodes 36 and 37, and thus the manufacturing process becomes complicated. On the contrary, in the present embodiment, the bonding material 35 is formed on the lid substrate wafer 50, and the lead-out electrodes 36 and 37 are formed on the base substrate wafer 40. Therefore, the formation of the lead-out electrodes 36 and 37 can be performed in parallel with the formation of the bonding material 35, and thus the manufacturing time can be reduced. In addition, since it is not necessary to consider diffusion between both members, it is possible to simplify the manufacturing process.

In a mounting step (S40), a plurality of manufactured piezoelectric vibrating reeds 4 is bonded to the upper surfaces of the lead-out electrodes 36 and 37 of the base substrate wafer 40. Specifically, first, bumps B made of gold or the like are formed on the pair of lead-out electrodes 36 and 37. The base portion 12 of the piezoelectric vibrating reed 4 is placed on the bumps B, and the piezoelectric vibrating reed 4 is pressed against the bumps B while heating the bumps B to a predetermined temperature. In this way, the base portion 12 is mechanically fixed to the bumps B in a state where the vibrating arms 10 and 11 of the piezoelectric vibrating reed 4 are floated from the upper surface of the base substrate wafer 40. In addition, the mount electrodes 16 and 17 are electrically connected to the lead-out electrodes 36 and 37.

In a superimposition step (S50), the lid substrate wafer 50 is superimposed onto the base substrate wafer 40 on which the mounting of the piezoelectric vibrating reed 4 is completed. Specifically, both wafers 40 and 50 are aligned at a correct position using reference marks or the like not shown in the figure as indices. In this way, the piezoelectric vibrating reed 4 mounted on the base substrate wafer 40 is accommodated in the cavity C which is surrounded by the recess portion 3a of the lid substrate wafer 50 and the base substrate wafer 40. At that time, the penetration holes 43 of the base substrate wafer 40 and the recess portions 3a of the lid substrate wafer 50 are superimposed in a positional relationship such that they do not communicate each other.

Figure 14:
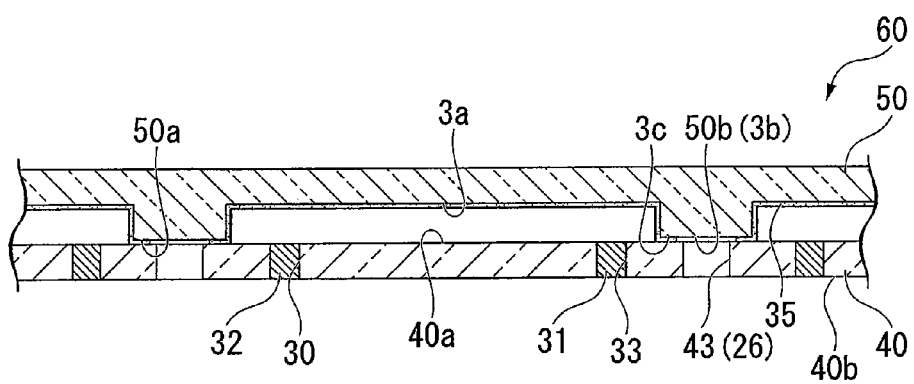
FIG. 14 is a cross-sectional view taken along the line E-E in FIG. 11.

FIG. 14 is a cross-sectional view taken along the line E-E in FIG. 11. In FIG. 14, for better understanding of the drawing, the illustrations of electronic components such as the piezoelectric vibrating reeds 4 accommodated in the cavity C are omitted.

After the two substrate wafers 40 and 50 are superimposed onto each other, anodic bonding is achieved under a predetermined temperature atmosphere with application of a predetermined voltage in a state where the two superimposed wafers 40 and 50 are inserted into an anodic bonding machine (not shown) and the outer peripheral portions of the wafers are clamped by a holding mechanism (not shown) (S60: bonding step). In this way, the piezoelectric vibrating reeds 4 can be sealed in the cavity C, and a wafer assembly 60 in which the base substrate wafer 40 and the lid substrate wafer 50 are bonded can be obtained.

When the wafer assembly 60 is heated in the bonding step (S60), outgas is discharged from the bonding material 35 of the wafer assembly 60. The outgas is discharged from the outer end (the gap between the two wafers 40 and 50) of the wafer assembly 60 and is also discharged to the outside through the penetration holes 43 of the base substrate wafer 40. That is, the penetration holes 43 of the base substrate wafer 40 function as the discharge ports of the outgas. Since the two wafers 40 and 50 are anodically bonded by the bonding material 35, the spaces between the penetration holes 43 and the cavity C are blocked by the bonding material 35 after the anodic bonding.

In an outer electrode forming step (S70), the outer electrodes 38 and 39 are formed on the rear surface of the base substrate wafer. Specifically, a conductive material is deposited on the outer surface 40b of the base substrate wafer 40 by sputtering or the like, and patterning is performed so that the conductive material remains on only both ends in the longitudinal direction of the base substrate 2. In this way, the outer electrodes 38 and 39 are formed. The conductive material used during the deposition is also deposited on the inner surfaces of the penetration holes 43 and the non-formation regions 50b of the lid substrate wafer 50 exposed from the penetration holes 43. In this way, the metal film 25 is formed on the inner surface of the penetration holes 43 and the non-formation regions 3b of the inner surface 50a of the lid substrate wafer 50. That is, since the outer electrodes 38 and 39 and the metal film 25 can be collectively formed in the outer electrode forming step (S70), it is not necessary to perform a step of forming the metal film 25 and it is possible to suppress the decrease in manufacturing efficiency caused by adding the metal film 25. At that time, since the metal film 25 and the bonding material 35 are separated, it is possible to prevent the outer electrodes 38 and 39 from being short-circuited by the bonding material 35.

In a fine tuning step (S80), the frequencies of the individual piezoelectric vibrators 1 are tuned finely. Specifically, first, a predetermined voltage is continuously applied from the outer electrodes 38 and 39 to vibrate the piezoelectric vibrating reed 4, and the vibration frequency is measured. In this state, a laser beam is irradiated onto the base substrate wafer 40 from the outer side to evaporate the fine tuning film 21b of the weight metal film 21. By doing so, since the weight on the tip end sides of the pair of vibrating arms 10 and 11 decreases, the frequency of the piezoelectric vibrating reed 4 increases. In this way, the frequency of the piezoelectric vibrator 1 is tuned finely so as to fall within the range of the nominal frequency.

In a cutting step (S90), the bonded wafer assembly 60 is cut along the cutting line M. Specifically, first, a UV tape is attached on the surface of the base substrate wafer 40 of the wafer assembly 60. Subsequently, a laser beam is irradiated along the cutting line M from the side of the lid substrate wafer 50 (scribing). Subsequently, the wafer assembly 60 is divided and cut along the cutting line M by a cutting blade pressing against the surface of the UV tape (breaking). After that, the UV tape is separated by irradiation of UV light. In this way, it is possible to divide the wafer assembly 60 into a plurality of piezoelectric vibrators 1. At that time, the penetration hole 43 formed around the cutting line M is divided into four parts, whereby fan-shaped notch portions 26 are formed at the corner portions of the respective base substrates 2. Similarly, the non-formation region 50*b* is also divided into four parts, whereby fan-shaped non-formation regions 3*b* are formed at the corner portions of the lid substrate 3. The wafer assembly 60 may be cut by other methods such as dicing.

In an electrical property test step (S100), the resonance frequency, resonance resistance value, drive level properties (the excitation power dependence of the resonance frequency and the resonance resistance value), and the like of the piezoelectric vibrator 1 are measured and checked. Moreover, the insulation resistance value properties and the like are checked as well. Finally, an external appearance test of the piezoelectric vibrator 1 is conducted to check the dimensions, the quality, and the like.

In this way, the piezoelectric vibrator 1 is manufactured.

As described above, in the present embodiment, the penetration holes 43 (the notch portions 26) which do not overlap with the bonding surface of the lid substrate wafer 50 are formed on the base substrate wafer 40.

Figure 20:
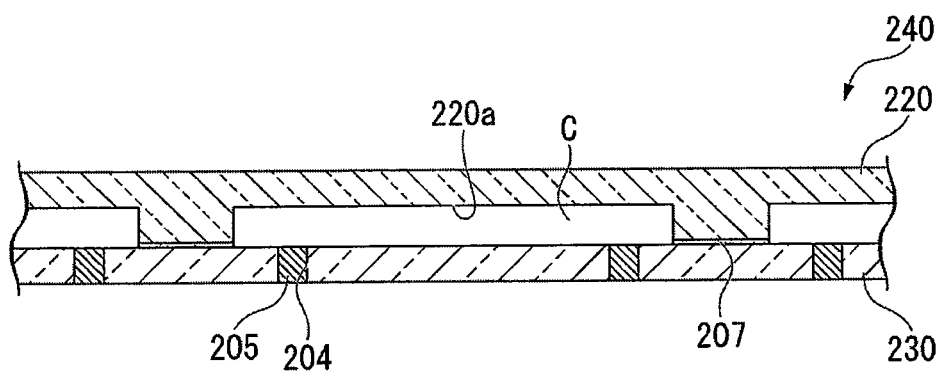
FIG. 20 is a cross-sectional view showing a wafer assembly according to the related art.

According to this configuration, by forming the penetration holes 43 on the base substrate wafer 40, the outgas generated from the bonding material 35 at the time of bonding the two wafers 40 and 50 is discharged through the penetration holes 43. That is, since the penetration holes 43 function as the discharge ports of the outgas from the bonding regions of the two wafers 40 and 50, the discharge ports are formed for each cavity C. Therefore, the outgas can be effectively discharged as compared to the related art in which the outgas is discharged from only the outer circumferential end of the wafers 220 and 230 (see FIG. 20). As a result, since the wafers 40 and 50 can be bonded in a state in which the presence of remaining outgas in the cavity C is suppressed, it is possible to provide a package 9 having excellent airtightness. Therefore, it is possible to improve the vacuum sealing reliability of the piezoelectric vibrator 1. Accordingly, since a series resonance resistance value (R1) of the piezoelectric vibrator 1 is maintained at a low state, it is possible to vibrate the piezoelectric vibrating reed 4 with a low power. Thus, it is possible to manufacture the piezoelectric vibrator 1 having excellent energy efficiency.

Furthermore, as described above, when the piezoelectric vibrator 1 is mounted on the silicon device 70, the wet portions of the solder 73 flow over the metal film 25 into the notch portions 26, whereby the fillets 75 which widen in a skirt shape are formed in the vicinities of the notch portions 26. Therefore, it is possible to increase the size of the bonding region between the piezoelectric vibrator 1 and the silicon device 70 and to improve the mounting strength of the piezoelectric vibrator 1.

Moreover, since the penetration holes 43 are formed at the same time as the penetration holes 30 and 31 in the penetration electrode forming step, the penetration holes 43 can be formed without increasing the number of manufacturing steps. Therefore, it is possible to provide the piezoelectric vibrator 1 having excellent airtightness while maintaining the manufacturing efficiency.

Oscillator

Next, an oscillator according to another embodiment of the invention will be described with reference to FIG. 15.

Figure 15:
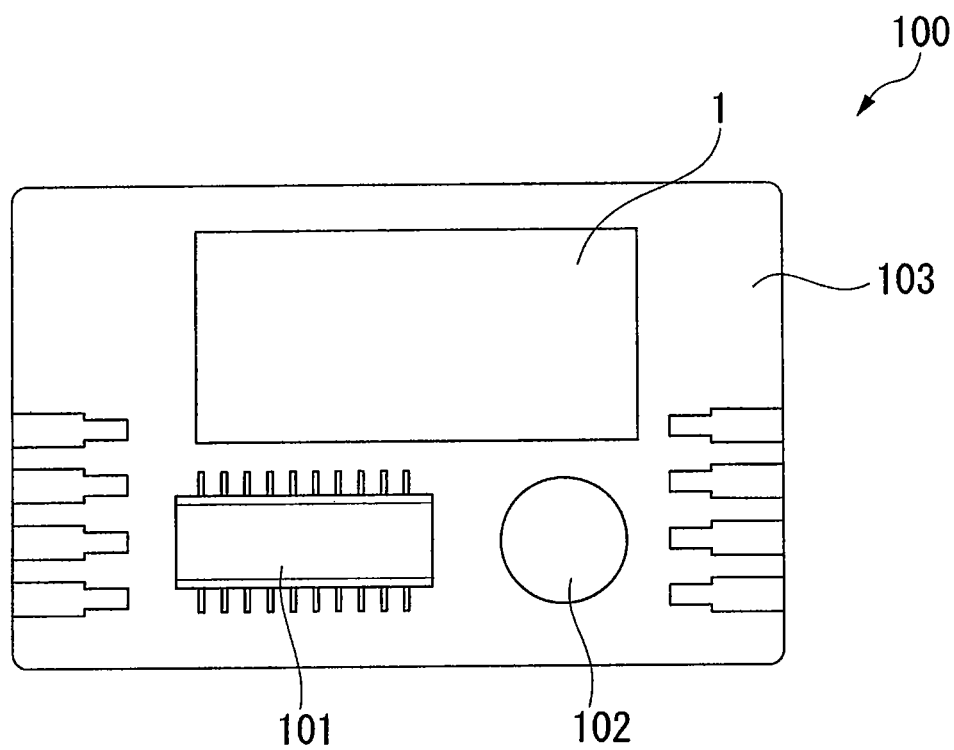
FIG. 15 is a view showing the configuration of an oscillator according to an embodiment of the present invention.

In an oscillator 100 according to the present embodiment, the piezoelectric vibrator 1 is used as an oscillating piece electrically connected to an integrated circuit 101, as shown in FIG. 15. The oscillator 100 includes a substrate 103 on which an electronic component 102, such as a capacitor, is mounted. The integrated circuit 101 for an oscillator is mounted on the substrate 103, and the piezoelectric vibrator 1 is mounted near the integrated circuit 101. The electronic component 102, the integrated circuit 101, and the piezoelectric vibrator 1 are electrically connected to each other by a wiring pattern (not shown). In addition, each of the constituent components is molded with a resin (not shown).

In the oscillator 100 configured as described above, when a voltage is applied to the piezoelectric vibrator 1, the piezoelectric vibrating reed 4 in the piezoelectric vibrator 1 vibrates. This vibration is converted into an electrical signal due to the piezoelectric property of the piezoelectric vibrating reed 4 and is then input to the integrated circuit 101 as the electrical signal. The input electrical signal is subjected to various kinds of processing by the integrated circuit 101 and is then output as a frequency signal. In this way, the piezoelectric vibrator 1 functions as an oscillating piece.

Moreover, by selectively setting the configuration of the integrated circuit 101, for example, an RTC (real time clock) module, according to the demands, it is possible to add a function of controlling the operation date or time of the corresponding device or an external device or of providing the time or calendar in addition to a single functional oscillator for a clock.

As described above, since the oscillator 100 according to the present embodiment includes the high-quality piezoelectric vibrator 1 in which the base substrate 2 and the lid substrate 3 are securely anodically bonded, and reliable airtightness of the cavity C is secured, and which has excellent energy efficiency, it is possible to increase the energy efficiency to achieve an improvement in the quality of the oscillator 100 itself. In addition to this, it is possible to obtain a highly accurate frequency signal which is stable over a long period of time.

Electronic Device

Figure 16:
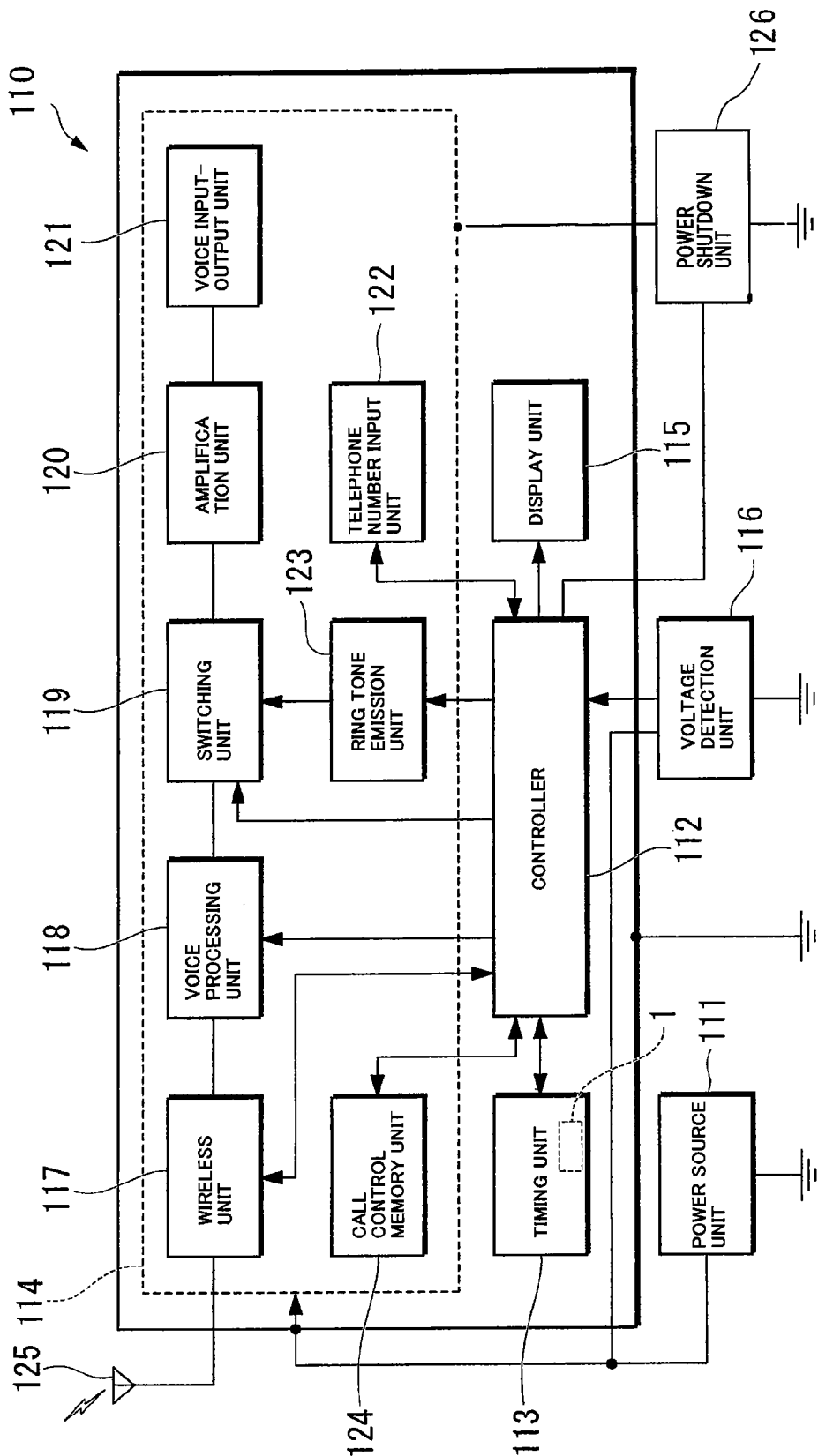
FIG. 16 is a view showing the configuration of an electronic device according to an embodiment of the present invention.

Next, an electronic device according to another embodiment of the invention will be described with reference to FIG. 16. In addition, a portable information device 110 including the piezoelectric vibrator 1 will be described as an example of an electronic device.

The portable information device 110 according to the present embodiment is represented by a mobile phone, for example, and has been developed and improved from a wristwatch in the related art. The portable information device 110 is similar to a wristwatch in external appearance, and a liquid crystal display is disposed in a portion equivalent to a dial pad so that a current time and the like can be displayed on this screen. Moreover, when it is used as a communication apparatus, it is possible to remove it from the wrist and to perform the same communication as a mobile phone in the related art with a speaker and a microphone built in an inner portion of the band. However, the portable information device 110 is very small and light compared with a mobile phone in the related art.

Next, the configuration of the portable information device 110 according to the present embodiment will be described. As shown in FIG. 16, the portable information device 110 includes the piezoelectric vibrator 1 and a power supply section 111 for supplying power. The power supply section 111 is formed of a lithium secondary battery, for example. A control section 112 which performs various kinds of control, a clock section 113 which performs counting of time and the like, a communication section 114 which performs communication with the outside, a display section 115 which displays various kinds of information, and a voltage detecting section 116 which detects the voltage of each functional section are connected in parallel to the power supply section 111. In addition, the power supply section 111 supplies power to each functional section.

The control section 112 controls an operation of the entire system. For example, the control section 112 controls each functional section to transmit and receive the audio data or to measure or display a current time. In addition, the control section 112 includes a ROM in which a program is written in advance, a CPU which reads and executes a program written in the ROM, a RAM used as a work area of the CPU, and the like.

The clock section 113 includes an integrated circuit, which has an oscillation circuit, a register circuit, a counter circuit, and an interface circuit therein, and the piezoelectric vibrator 1. When a voltage is applied to the piezoelectric vibrator 1, the piezoelectric vibrating reed 4 vibrates, and this vibration is converted into an electrical signal due to the piezoelectric property of crystal and is then input to the oscillation circuit as the electrical signal. The output of the oscillation circuit is binarized to be counted by the register circuit and the counter circuit. Then, a signal is transmitted to or received from the control section 112 through the interface circuit, and current time, current date, calendar information, and the like are displayed on the display section 115.

The communication section 114 has the same function as a mobile phone in the related art, and includes a wireless section 117, an audio processing section 118, a switching section 119, an amplifier section 120, an audio input/output section 121, a telephone number input section 122, a ring tone generating section 123, and a call control memory section 124.

The wireless section 117 transmits/receives various kinds of data, such as audio data, to/from the base station through an antenna 125. The audio processing section 118 encodes and decodes an audio signal input from the wireless section 117 or the amplifier section 120. The amplifier section 120 amplifies a signal input from the audio processing section 118 or the audio input/output section 121 up to a predetermined level. The audio input/output section 121 is formed by a speaker, a microphone, and the like, and amplifies a ring tone or incoming sound louder or collects the sound.

In addition, the ring tone generating section 123 generates a ring tone in response to a call from the base station. The switching section 119 switches the amplifier section 120, which is connected to the audio processing section 118, to the ring tone generating section 123 only when a call arrives, so that the ring tone generated in the ring tone generating section 123 is output to the audio input/output section 121 through the amplifier section 120.

In addition, the call control memory section 124 stores a program related to incoming and outgoing call control for communications. Moreover, the telephone number input section 122 includes, for example, numeric keys from 0 to 9 and other keys. The user inputs a telephone number of a communication destination by pressing these numeric keys and the like.

The voltage detecting section 116 detects a voltage drop when a voltage, which is applied from the power supply section 111 to each functional section, such as the control section 112, drops below the predetermined value, and notifies the control section 112 of the detection. In this case, the predetermined voltage value is a value which is set beforehand as the lowest voltage necessary to operate the communication section 114 stably. For example, it is about 3 V. When the voltage drop is notified from the voltage detecting section 116, the control section 112 disables the operation of the wireless section 117, the audio processing section 118, the switching section 119, and the ring tone generating section 123. In particular, the operation of the wireless section 117 that consumes a large amount of power should be necessarily stopped. In addition, a message informing that the communication section 114 is not available due to insufficient battery power is displayed on the display section 115.

That is, it is possible to disable the operation of the communication section 114 and display the notice on the display section 115 by the voltage detecting section 116 and the control section 112. This message may be a character message. Or as a more intuitive indication, a cross mark (X) may be displayed on a telephone icon displayed at the top of the display screen of the display section 115.

In addition, the function of the communication section 114 can be more reliably stopped by providing a power shutdown section 126 capable of selectively shutting down the power of a section related to the function of the communication section 114.

As described above, since the portable information device 110 according to the present embodiment includes the high-quality piezoelectric vibrator 1 in which the base substrate 2 and the lid substrate 3 are securely anodically bonded, and reliable airtightness of the cavity C is secured, and which has excellent energy efficiency, it is possible to increase the energy efficiency to achieve an improvement in the quality of the portable information device 110 itself. In addition to this, it is possible to display highly accurate clock information which is stable over a long period of time.

Radio-Controlled Timepiece

Next, a radio-controlled timepiece according to still another embodiment of the invention will be described with reference to FIG. 17.

Figure 17:
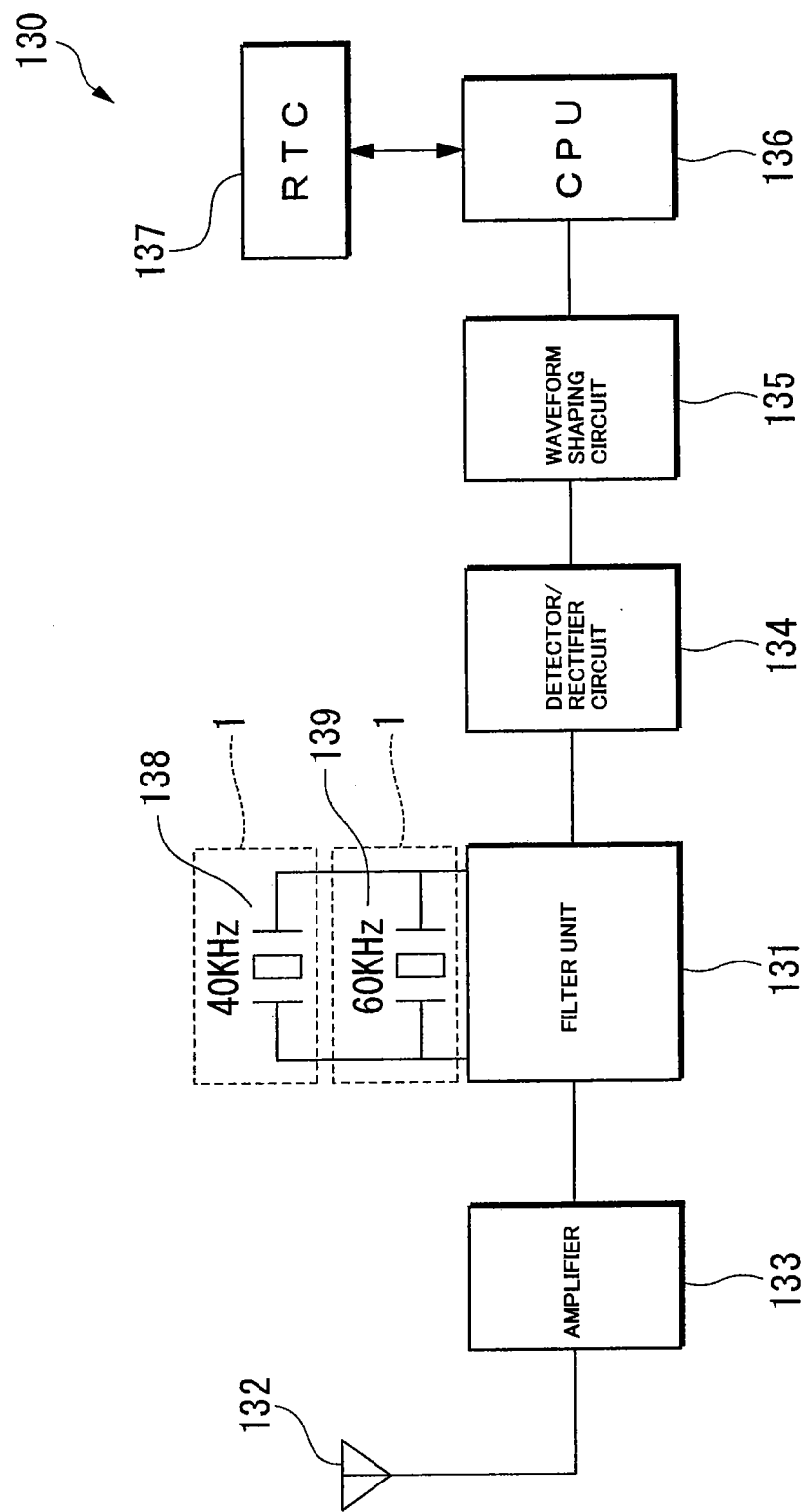
FIG. 17 is a view showing the configuration of a radio-controlled timepiece according to an embodiment of the present invention.
Figure 18:
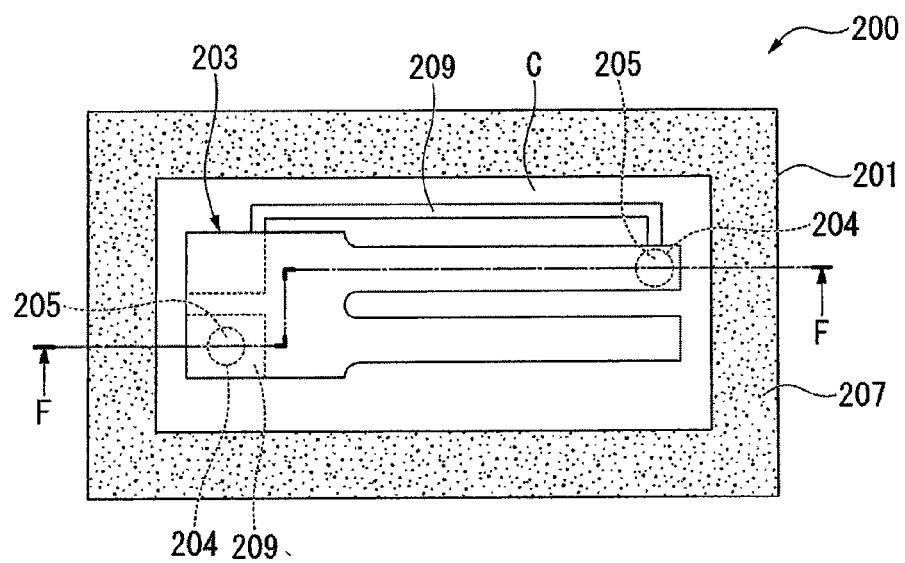
FIG. 18 is a top view showing an inner structure of a piezoelectric vibrator according to the related art, showing a state where a lid substrate is removed.
Figure 19:
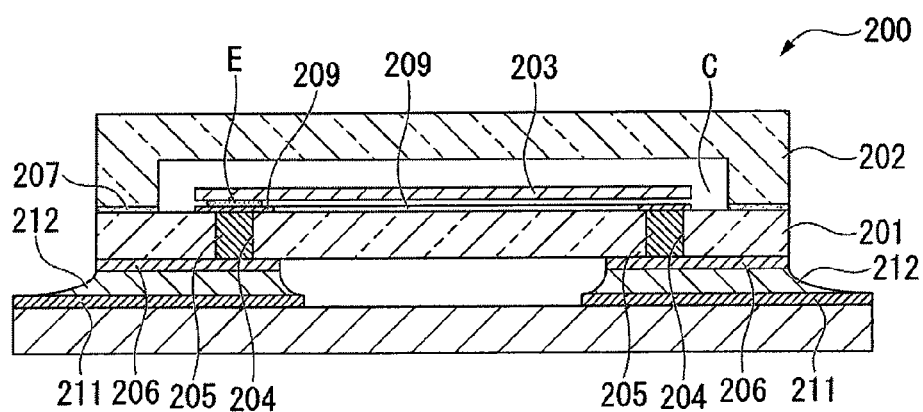
FIG. 19 is a cross-sectional view of a piezoelectric vibrating device according to the related art, taken along the line F-F in FIG. 18.

As shown in FIG. 17, a radio-controlled timepiece 130 according to the present embodiment includes the piezoelectric vibrators 1 electrically connected to a filter section 131. The radio-controlled timepiece 130 is a clock with a function of receiving a standard radio wave including the clock information, automatically changing it to the correct time, and displaying the correct time.

In Japan, there are transmission centers (transmission stations) that transmit a standard radio wave in Fukushima Prefecture (40 kHz) and Saga Prefecture (60 kHz), and each center transmits the standard radio wave. A long wave with a frequency of, for example, 40 kHz or 60 kHz has both a characteristic of propagating along the land surface and a characteristic of propagating while being reflected between the ionosphere and the land surface, and therefore has a propagation range wide enough to cover the entire area of Japan through the two transmission centers.

Hereinafter, the functional configuration of the radio-controlled timepiece 130 will be described in detail.

An antenna 132 receives a long standard radio wave with a frequency of 40 kHz or 60 kHz. The long standard radio wave is obtained by performing AM modulation of the time information, which is called a time code, using a carrier wave with a frequency of 40 kHz or 60 kHz. The received long standard wave is amplified by an amplifier 133 and is then filtered and synchronized by the filter section 131 having the plurality of piezoelectric vibrators 1. In the present embodiment, the piezoelectric vibrators 1 include crystal vibrator sections 138 and 139 having resonance frequencies of 40 kHz and 60 kHz, respectively, which are the same frequencies as the carrier frequency.

In addition, the filtered signal with a predetermined frequency is detected and demodulated by a detection and rectification circuit 134. Then, the time code is extracted by a waveform shaping circuit 135 and counted by the CPU 136. The CPU 136 reads the information including the current year, the total number of days, the day of the week, the time, and the like. The read information is reflected on an RTC 137, and the correct time information is displayed.

Because the carrier wave is 40 kHz or 60 kHz, a vibrator having the tuning fork structure described above is suitable for the crystal vibrator sections 138 and 139.

Moreover, although the above explanation has been given for the case of Japan, the frequency of a long standard wave is different in other countries. For example, a standard wave of 77.5 kHz is used in Germany. Therefore, when the radio-controlled timepiece 130 which is also operable in other countries is assembled in a portable device, the piezoelectric vibrator 1 corresponding to frequencies different from the frequencies used in Japan is necessary.

As described above, since the radio-controlled timepiece 130 according to the present embodiment includes the high-quality piezoelectric vibrator 1 in which the base substrate 2 and the lid substrate 3 are securely anodically bonded, and reliable airtightness of the cavity C is secured, and which has excellent energy efficiency, it is possible to increase the energy efficiency to achieve an improvement in the quality of the radio-controlled timepiece 130 itself. In addition to this, it is possible to count the time highly accurately and stably over a long period of time.

It should be noted that the technical scope of the present invention is not limited to the embodiments above, and the present invention can be modified in various ways without departing from the spirit of the present invention. That is, specific materials and layer structures exemplified in the embodiments are only examples and can be appropriately changed.

In the above-described embodiment, although the bonding material 35 is formed on the inner surface 50a of the lid substrate wafer 50, contrary to this, the bonding material 35 may be formed on the inner surface 40a of the base substrate wafer 40. In this case, it is necessary to perform patterning of the bonding material 35 so that the bonding film 35 does not come into contact with the metal film 25.

Moreover, in the above-described embodiment, although the notch portions 26 are formed at the respective corner portions, the shape, size, number, and the like of the notch portions 26 may be appropriately changed. For example, in the above-described embodiment, although the fan-shaped notch portions 26 are formed at the corner portions of the base substrate 2, penetration holes (notch portions) may be formed so as to reach the frame region 3c of the lid substrate 3.

Furthermore, in the above-described embodiment, although the metal film 25 is formed directly on the non-formation regions 3b, the metal film 25 may be formed with an insulating film disposed therebetween.

In the above-described embodiment, although the piezoelectric vibrator is manufactured by sealing the piezoelectric vibrating reed on the inner side of the package while using the package manufacturing method according to the present invention, devices other than the piezoelectric vibrator may be manufactured by sealing an electronic component other than the piezoelectric vibrating reed on the inner side of the package.

In the above-described embodiment, although the case where the present invention is applied to the two-layered piezoelectric vibrator 1 in which the cavity C is formed between the base substrate 2 and the lid substrate 3 was described, the present invention is not limited to this, and the present invention may be applied to a three-layered piezoelectric vibrator in which a piezoelectric substrate is interposed between a base substrate and a lid substrate.

What is claimed is:

1. A piezoelectric vibrator comprising:
   a hermetically closed casing comprising first and second substrates anodically bonded at respective bonding faces thereof and defining a cavity therebetween, wherein the second substrate includes square corner regions and the first substrate includes notches in a thickness direction in a periphery thereof, the notches exposing an associated square corner regions at the bonding face;
   a bonding film at the bonding face of the first and second substrates;
   a metal film in at least some of the notches and overlying the associated square corner region of the second substrate and abutting the bonding film, the metal film extending over an outer surface of the first substrate and providing external electrodes thereon; and
   a piezoelectric vibrating reed secured inside the cavity and electrically coupled to the external electrodes by electrically conductive throuqh-holes in the first substrate.

2. The piezoelectric vibrator according to claim 1, wherein the first substrate includes corners and the notches are located at some of the corners.

3. The piezoelectric vibrator according to claim 1, wherein the notches extend through the periphery of the first substrate.

4. The piezoelectric vibrator according to claim 1, wherein the notches have an arcuate shape.

5. An oscillator comprising the piezoelectric vibrator defined in claim 1.

6. An electronic device comprising the piezoelectric vibrator defined in claim 1 which is electrically connected to a clock section of the electronic device.

7. A radio-controlled timepiece comprising the piezoelectric vibrator defined in claim 1 which is electrically connected to a filter section of the radio-controlled timepiece.

* * * * *